United States Patent
Yoon et al.

(10) Patent No.: US 9,268,075 B1
(45) Date of Patent: Feb. 23, 2016

(54) METHOD OF MANUFACTURING WIRE GRID POLARIZER

(71) Applicant: Samsung Display Co. Ltd., Yongin, Gyeonggi-Do (KR)

(72) Inventors: Dae Ho Yoon, Seoul (KR); Seung Won Park, Seoul (KR); Moon Gyu Lee, Suwon-si (KR); Tae Woo Kim, Seoul (KR); Lei Xie, Suwon-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/678,506

(22) Filed: Apr. 3, 2015

(30) Foreign Application Priority Data

Jan. 8, 2015 (KR) ......................... 10-2015-0002515

(51) Int. Cl.
*G02B 5/30* (2006.01)
*G02B 5/18* (2006.01)

(52) U.S. Cl.
CPC ............ *G02B 5/3058* (2013.01); *G02B 5/1809* (2013.01); *G02B 5/30* (2013.01); *G02B 5/3075* (2013.01)

(58) Field of Classification Search
CPC .. G02B 5/1809; G02B 5/3058; G02B 5/3075; G02B 5/30; G02F 1/11; G03F 7/0002
See application file for complete search history.

(56) References Cited

U.S. PATENT DOCUMENTS

| | | | | |
|---|---|---|---|---|
| 2008/0037101 A1* | 2/2008 | Jagannathan | ........ | G02B 5/3058 359/286 |
| 2014/0144875 A1* | 5/2014 | Lim | ..................... | G02B 5/3058 216/24 |

FOREIGN PATENT DOCUMENTS

| KR | 10-2008-0024316 | 3/2008 |
|---|---|---|
| KR | 10-2009-0101137 | 9/2009 |
| KR | 10-2010-0068417 | 6/2010 |
| KR | 10-2010-0080336 | 7/2010 |
| KR | 10-2014-0030873 | 3/2014 |

OTHER PUBLICATIONS

Jeong et al., "Ultralarge-Area Block Copolymer Lithography Enabled by Disposable Photoresist Prepatterning." ACS Nano, vol. 4, No. 9, 2010, pp. 5181-5186.

* cited by examiner

*Primary Examiner* — Duy Deo
(74) *Attorney, Agent, or Firm* — Innovation Counsel LLP (57) ABSTRACT

Provided is a method of manufacturing a wire gird polarizer. The method includes sequentially stacking a conductive wire layer and a first neutral layer, forming guide patterns, reducing widths of the guide patterns and patterning the first neutral layer, forming a second neutral layer, applying a first block copolymer, arranging the first block copolymer as a first monomer block and a second monomer block, removing one of the first monomer block and the second monomer block, removing the second neutral layer exposed, removing the remaining monomer block and the guide patterns, applying a second block copolymer, arranging the second block copolymer as a third monomer block and a fourth monomer block, removing one of the third monomer block and the fourth monomer block, and patterning the conductive wire layer to thereby form conductive wire patterns.

20 Claims, 12 Drawing Sheets

METHOD OF MANUFACTURING WIRE GRID POLARIZER

CROSS-REFERENCE TO RELATED APPLICATION

This application claims the benefit of Korean Patent Application No. 10-2015-0002515 filed on Jan. 8, 2015, with the Korean Intellectual Property Office, the disclosure of which is incorporated herein by reference.

BACKGROUND

1. Field Inventive Concept

The present inventive concept relates to a method of manufacturing a wire grid polarizer.

2. Description of the Related Art

In general, an array of parallel conducting wires in which parallel conductor wires are arranged in order to polarize only specific polarized light in electromagnetic waves may be called a wire grid.

A wire grid structure having a cycle shorter than a wavelength of corresponding light may have polarizing characteristics in which the wire grid structure may reflect light vibrating in a direction parallel to the wire direction while pass through light vibrating in a direction perpendicular to the wire direction. This type of polarizer is advantageous in that reflected polarized light may be reused, as compared to an absorbing type polarizer.

As demand for the miniaturization and compactification of devices has been continuously made, the development of a fine pattern process has been required. In particular, in order to develop various types of the next generation nano-scale devices, manufacturing nano-scale patterns having a large area with a high density through a process requiring a relatively inexpensive cost may be important.

Until now, photolithography technologies such as I-line, ArF and the like have been mainly used. However, there is a limitation in manufacturing patterns having a size of about 25 nm or less. Further, photolithography technologies for forming the wire grid polarizer have problem in that regions covered with photoresist remain unpatterned.

SUMMARY

An aspect of the present disclosure may provide a method of manufacturing a wire grid polarizer having a uniform overall interval.

An aspect of the present disclosure may also provide a method of manufacturing a wire grid polarizer including a reflective plate in a non-opening region and having a uniform interval in an opening region.

According to one embodiment of the present inventive concept, there is provided a method of manufacturing a wire gird polarizer comprising sequentially stacking a conductive wire layer and a first neutral layer on a substrate, forming guide patterns having a uniform interval on the first neutral layer, reducing widths of the guide patterns and patterning the first neutral layer to thereby form first neutral layer patterns coating, forming a second neutral layer on a portion of the conductive wire layer between the first neutral layer patterns, applying a first block copolymer of a first monomer and a second monomer having different etch rates to the second neutral layer, arranging the first block copolymer as a first monomer block and a second monomer block, removing one of the first monomer block and the second monomer block, removing the second neutral layer exposed by removing the one of the first monomer block and the second monomer block, removing the remaining monomer block and the guide patterns, applying a second block copolymer of a third monomer and a fourth monomer having different etch rates to the resultant product, arranging the second block copolymer as a third monomer block and a fourth monomer block, removing one of the third monomer block and the fourth monomer block and patterning the conductive wire layer to thereby form conductive wire patterns.

The first monomer block is identical to the third monomer block and the second monomer block is identical to the fourth monomer block.

The reducing of the widths of the guide patterns includes plasma treatment.

Gas used in the plasma treatment includes $O_2$.

Gas used in the plasma treatment further includes $SF_6$ or CF-based gas.

The first neutral layer and the second neutral layer contain a random copolymer.

The arranging of the first block copolymer and the second block copolymer is performed through thermal annealing or solvent annealing.

The patterning of the conductive wire layer further includes removing a second neutral layer patterns on the conductive wire layer and the monomer blocks on the second neutral layer patterns.

The reducing of the widths of the guide patterns and the patterning of the first neutral layer to thereby form first neutral layer patterns includes forming surface treatment layers on upper and side surfaces of the guide patterns.

The surface treatment layers are fluorine-containing hydrophobic layers.

According to another embodiment of the present inventive concept, there is provided a method of manufacturing a wire gird polarizer comprising sequentially stacking a conductive wire layer and a first neutral layer on a substrate forming guide patterns on the first neutral layer, reducing widths of the guide patterns and patterning the first neutral layer to thereby form first neutral layer patterns coating, forming a second neutral layer on a portion of the conductive wire layer between the first neutral layer patterns, applying a first block copolymer of a first monomer and a second monomer having different etch rates to the second neutral layer, arranging the first block copolymer as a first monomer block and a second monomer block, removing one of the first monomer block and the second monomer block, removing the second neutral layer exposed by removing the one of the first monomer block and the second monomer block, removing the remaining monomer block and the guide patterns applying a second block copolymer of a third monomer and a fourth monomer having different etch rates to the resultant product arranging the second block copolymer as a third monomer block and a fourth monomer block and removing one of the third monomer block and the fourth monomer block and patterning the conductive wire layer to thereby form conductive wire patterns, wherein the guide patterns includes a first guide pattern formed in an opening region and a second guide pattern formed in a non-opening region, and the first guide pattern has a relatively narrower width than that of the second guide pattern.

The first monomer block is identical to the third monomer block and the second monomer block is identical to the fourth monomer block.

The reducing of the widths of the guide patterns includes plasma treatment.

Gas used in the plasma treatment includes $O_2$.

Gas used in the plasma treatment further includes SF6 or CF-based gas.

The first neutral layer and the second neutral layer contain a random copolymer.

The arranging of the first block copolymer and the second block copolymer is performed through thermal annealing or solvent annealing.

The patterning of the conductive wire layer further includes removing the first guide pattern, a second neutral layer patterns, and the monomer blocks on the second neutral layer patterns.

The reducing of the widths of the guide patterns and the patterning of the first neutral layer to thereby form first neutral layer patterns includes forming surface treatment layers on upper and side surfaces of the guide patterns.

The surface treatment layers are fluorine-containing hydrophobic layers.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Advantages and features of the present inventive concept and methods of accomplishing the same may be understood more readily by reference to the following detailed description of embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the inventive concept to those skilled in the art, and the present inventive concept will only be defined by the appended claims.

The same reference numbers indicate the same components throughout the specification.

In the drawings, the thickness of layers and regions are exaggerated for clarity.

It will be understood that when an element or layer is referred to as being "on" or "connected to" another element or layer, it can be directly on or connected to the other element or layer or intervening elements or layers may be present between them. In contrast, when an element is referred to as being "directly on" or "directly connected to" another element or layer, there are no intervening elements or layers present between them.

Hereinafter, embodiments of the present inventive concept will be described with reference to the drawings.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout the specification to designate the same or like elements.

FIGS. 1 through 16 are cross-sectional views illustrating respective manufacturing processes of a wire grid polarizer according to an exemplary embodiment of the present inventive concept.

Figure 1:
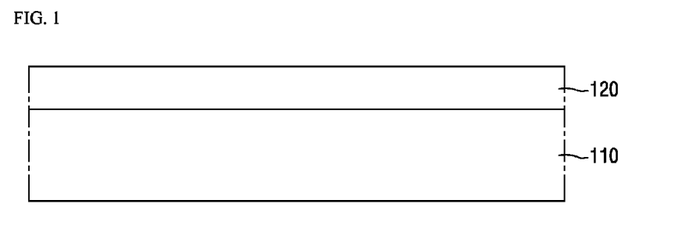
FIGS. 1, 2, 3, 4, 5, 6, 7, 8, 9, 10, 11, 12, 13, 14, 15 and 16 are cross-sectional views illustrating respective manufacturing processes of a wire grid polarizer according to an exemplary embodiment of the present inventive concept.

Referring to FIG. 1, a conductive wire layer 120 may be formed on a substrate 110.

A material of the substrate 110 may be appropriately selected depending on the usage and a process, as long as it may allow visible light to pass therethrough. Examples of the material of the substrate 110 may be various types of polymers and the like, such as glass, quartz, acrylics, TAC(triacetylcellulose), COP(cyclic olefin copolymer), COC(cyclic olefin polymer), PC(polycarbonate), PET(polyethylene naphthalate), PI(polyimide), PEN(polyethylene naphthalate), PES(polyether sulfone), PAR(polyarylate), and the like, but are not limited thereto. The substrate 110 may be formed as an optical film substrate having a predetermined degree of flexibility.

A material of the conductive wire layer 120 may not be limited as long as it is a conductive material. In an exemplary embodiment, the conductive wire layer 120 may be formed of a metal material and more particularly, may be formed of a single metal selected from a group consisting of aluminum (Al), chrome (Cr), silver (Ag), copper (Cu), Nickel (Ni), titanium (Ti), cobalt (Co), and molybdenum (Mo) or alloys thereof. However, the material of the conductive wire layer 120 is not limited thereto.

In some cases, the conductive wire layer 120 may include two or more layers. For example, a first conductive wire layer (not shown) may be formed of aluminum and a second conductive wire layer (not shown) may be formed of titanium (Ti) or molybdenum (Mo), but they are not limited thereto. In the case that the first conductive wire layer (not shown) may be formed of aluminum, a hillock may be caused in the layer depending on a process temperature in a subsequent process, such that an upper surface of the layer may not be uniform to thereby result in a deterioration in optical characteristics of a product. In order to prevent the defects, the second conductive wire layer (not shown) formed of titanium (Ti) or molybdenum (Mo) may be formed on the first conductive wire layer (not shown) to thereby prevent the occurrence of a hillock that may be caused during a process.

A method of forming the conductive wire layer 120 may be performed by using a general sputtering method, a chemical vapor deposition method, an evaporation method and the like, but is not limited thereto.

Figure 2:
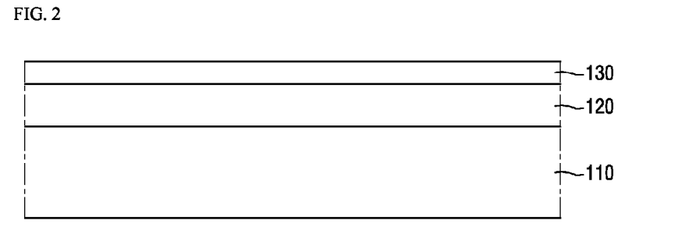

Referring to FIG. 2, a first neutral layer 130 may be coated on the conductive wire layer 120. The first neutral layer 130 may be coated by a method such as a spin coating method, but is not limited thereto.

The first neutral layer 130 may contain a random copolymer of monomers of a block copolymer for the arrangement of the block copolymer, which will be conducted later, but is not limited thereto.

In an exemplary embodiment, the first neutral layer 130 may be formed of PS-r-PMMA(poly(styrene-r-methylmethacrylate)), PS-r-PB(poly(styrene-r-butadiene)), PS-r-PI (poly(styrene-r-isoprene)), PS-r-PE(poly(styrene-r-ethylene)), PS-r-PEO(poly(styrene-r-ethyleneoxide)), PS-r-PFS (poly(styrene-r-ferrocenyldimethylsilane)), PS-r-P2VP(poly (styrene-r-(2-vinylpyridine))), PS-r-PDMS(poly(styrene-r-dimethylsiloxane)), or the like.

Figure 3:
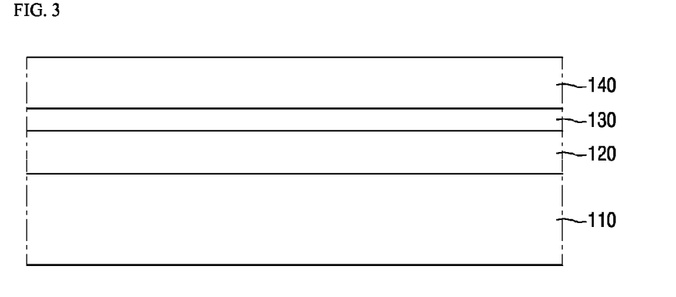

Referring to FIG. 3, a guide pattern layer 140 may be formed on the first neutral layer 130.

The guide pattern layer 140 may be a soft pattern layer formed of photoresist, an organic substance, or the like or may be a hard pattern layer formed of a metal, an inorganic substance or the like. For example, for convenience in a process, photoresist may be used but is not limited thereto.

Figure 4:
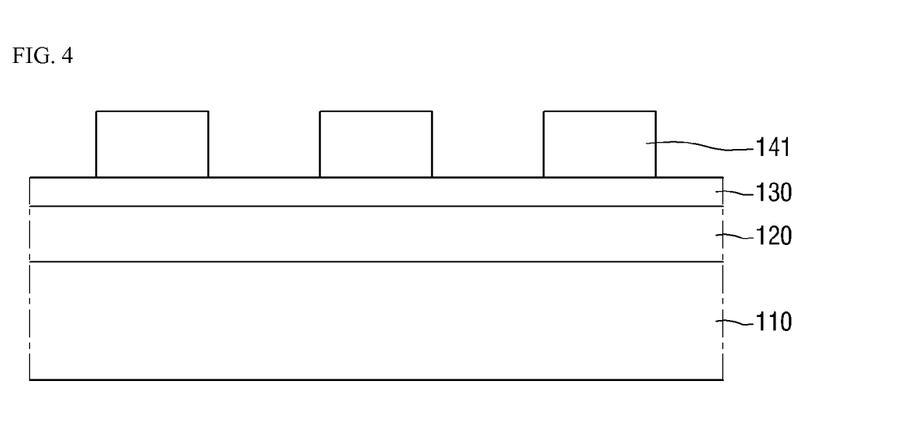

Referring to FIG. 4, the guide pattern layer 140 may be patterned to form guide patterns 141.

In an exemplary embodiment, exposure and development processes may be performed on the guide pattern layer 140 formed of photoresist, using a mask or the like to thereby form the guide patterns 141. However, formation of the guide patterns 141 is not limited thereto, and various patterning methods may be used. The guide patterns 141 may be patterned such that they are disposed at a uniform interval.

Figure 5:
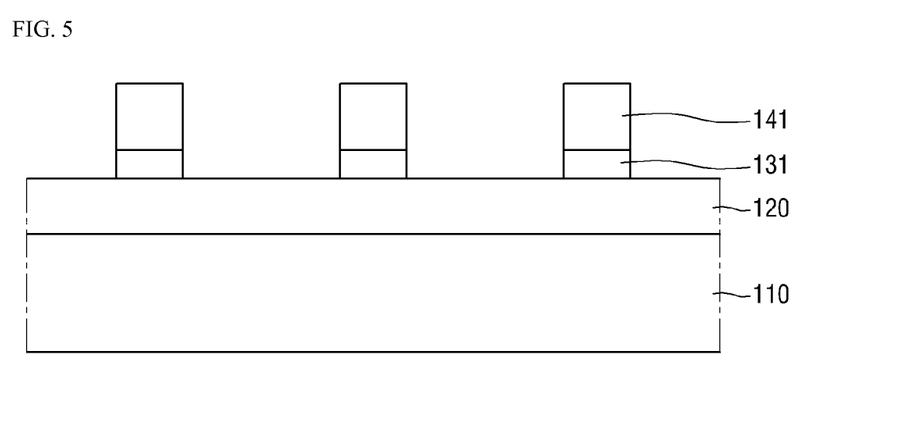

Referring to FIG. 5, a trimming process for reducing widths of the patterned guide patterns 141 may be undertaken.

In this case, the first neutral layer 130 may also be patterned in the same pattern as that of the guide patterns 141 to form first neutral layer patterns 131. The widths of the guide patterns 141 may be 200 nm or less and the first neutral layer patterns 131 may be formed to coincide with the guide patterns 141.

The trimming process may be implemented through oxygen plasma ($O_2$ plasma) treatment but is not limited thereto. During the oxygen plasma treatment, $SF_6$ or CF-based gas may be further added and examples of the CF-based gas may include $C_4F_8$, $CHF_3$, $CH_2F_2$, $C_4F_8$, $CF_4$, $C_2F_6$ and the like but are not limited thereto.

Figure 6:
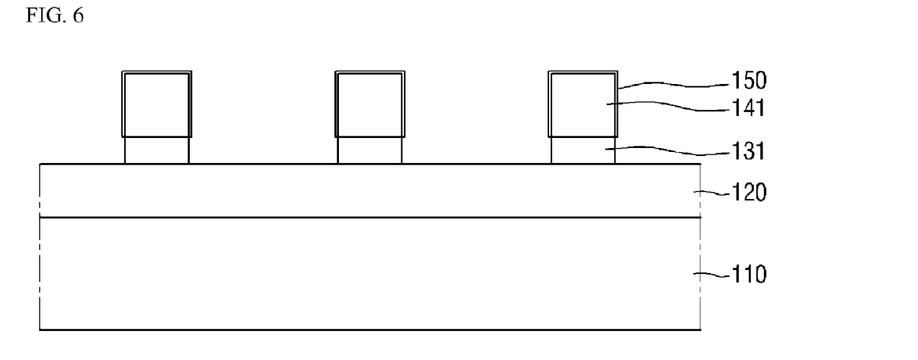

Referring to FIG. 6, surface treatment layers 150 may be formed on upper and side surfaces of the guide patterns 141.

The surface treatment layers 150 may be fluorine-containing hydrophobic layers, but are not limited thereto. Since the surface treatment layers 150 contain fluorine, a carbon (C)-fluorine (F) bond may be formed between the guide pattern 141 and the surface treatment layer 150. However, since the conductive wire layer 120 and the first neutral layer patterns 131 do not contain carbon, they may not react with fluorine (F) in the surface treatment layer 150. Thus, the surface treatment layers 150 may not be formed on a surface of the conductive wire layer 120 exposed by the trimming process and side surfaces of the first neutral layer patterns 131.

In addition, each surface treatment layer 150 may be formed as a monolayer, for example, but is not limited thereto. A method of forming the surface treatment layers 150 may be an atomic layer deposition (ALD) method or the like for the formation of a monolayer, but is not limited thereto. Other existing methods for forming a thin film may be used. In an exemplary embodiment, in order to form the surface treatment layers 150 on the side surfaces of the guide patterns 141 in the same manner, a chemical atomic layer deposition (chemical ALD) method may be used.

Here, the surface treatment layers 150 may be hydrophobic layers with respect to one of monomer blocks 171 and 172 of first block copolymers 170 to be disposed later.

Figure 7:
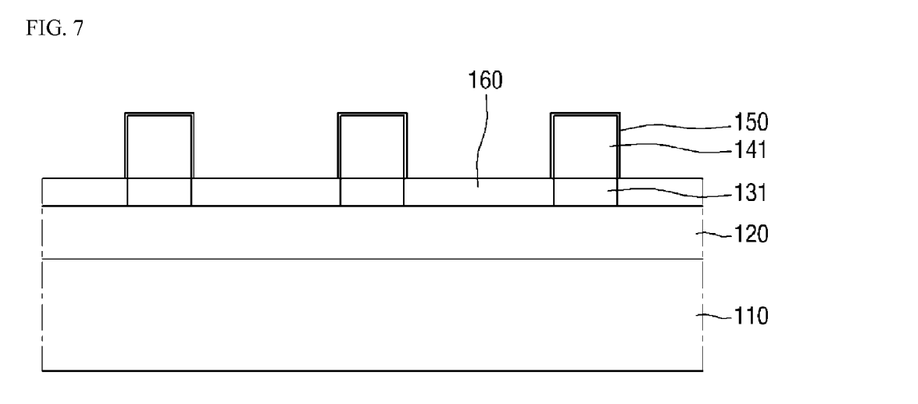

Referring to FIG. 7, a second neutral layer 160 may be coated on the conductive wire layer 120 to which the first neutral layer patterns 131 are removed.

In this case, the second neutral layer 160 may be formed to have the same thickness as the first neutral layer patterns 131 disposed on lower portions of the guide patterns 141. More specifically, the second neutral layer 160 may be formed on a region from which the first neutral layer 130 is removed by the trimming process and may be connected to the first neutral layer patterns 131.

The second neutral layer 160 may be coated in the same manner and may contain the same material, as that of the first neutral layer 130.

Figure 8:
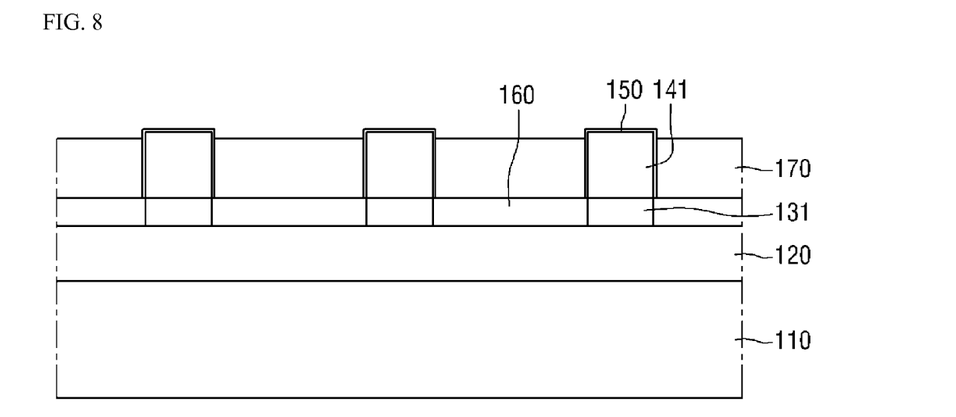

Referring to FIG. 8, trench spaces on the second neutral layer 160 may be filled with the first block copolymers 170 of two monomers having different etch rates.

In an exemplary embodiment, the first block copolymers 170 may be PS-b-PMMA(poly(styrene-b-methylmethacrylate)), PS-b-PB(poly(styrene-b-butadiene)), PS-b-PI(poly(styrene-b-isoprene)), PS-b-PE(poly(styrene-b-ethylene)), PS-b-PEO(poly(styrene-b-ethyleneoxide)), PS-b-PFS(poly(styrene-b-ferrocenyldimethylsilane)), PS-b-P2VP(poly(styrene-b-(2-vinylpyridine))), PS-b-PDMS(poly(styrene-b-dimethylsiloxane)), or the like.

Figure 9:
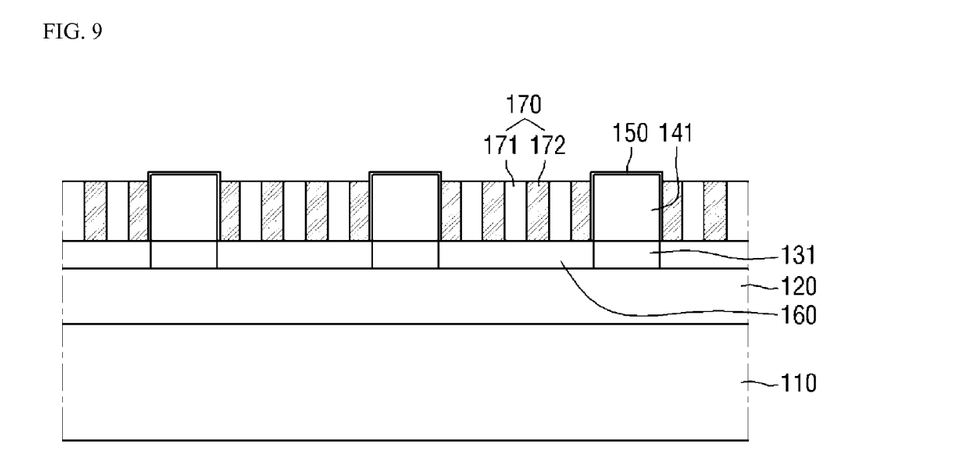

Referring to FIG. 9, the first block copolymers 170 may be phase-separated into first monomer blocks 171 and second monomer blocks 172 arranged alternatingly.

The first monomer blocks 171 and the second monomer blocks 172 of the first block copolymers 170 may be formed using materials different from each other in terms of etch rates thereof as well as in terms of hydrophilicity and hydrophobicity.

In an exemplary embodiment, the side surfaces of the surface treatment layers 150 may have selectivity with respect to one of the first monomer blocks 171 and the second monomer blocks 172. More specifically, the side surfaces of the surface treatment layers 150 may have hydrophilicity, such that the first block copolymers 170 may be further effectively arranged.

A method of arranging the first block copolymers 170 may be a thermal annealing method, a solvent annealing method or the like, but is not limited thereto. In general, as compared to the thermal annealing method of applying heat, the solvent annealing method of performing annealing within a chamber containing an evaporated solvent may be advantageous in terms of a reduction in arrangement time, the methods may be appropriately conducted according to an overall process architecture.

However, in the case of performing a process using the solvent annealing method, heights of the guide patterns 141 after the trimming process may be formed to be equal to or greater than 2.5 times of coating heights of the first block copolymers 170. In a solvent annealing process, since the evaporated solvent may penetrate into the block copolymer and a swelling phenomenon may be occurred, the heights needs to be secured such that the guide patterns 141 may not overflow and a smooth arrangement may be made.

Figure 10:
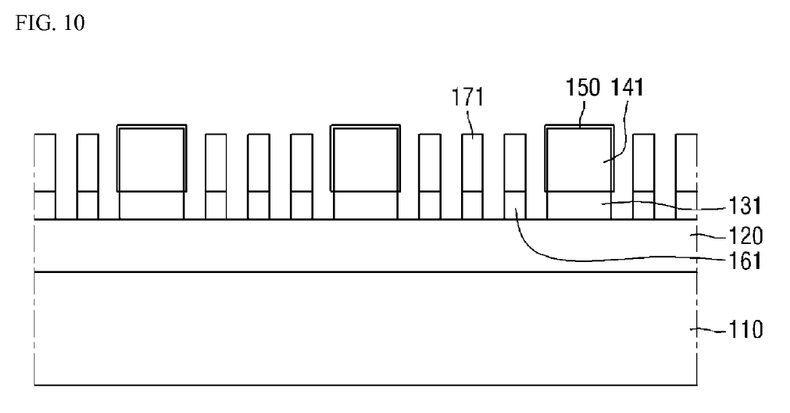

Referring to FIG. 10, the second monomer blocks 172 having a relatively high etch rate may be selectively removed.

While the second monomer blocks 172 having a relatively high etch rate are removed, portions of the exposed second neutral layer 160 disposed under the second monomer blocks 172 having a relatively high etch rate may also be removed. A first neutral layer pattern 131 formed in a region overlapping the guide pattern 141 may have substantially the same width as the guide pattern 141, and another second neutral layer pattern 161 formed in a region overlapping the first monomer block 171 having a relatively low etch rate may have substantially the same width as the first monomer block 171 having a relatively low etch rate.

Thus, the first neutral layer pattern 131 formed in the region overlapping the guide pattern 141 may have a relatively large width, while the second neutral layer pattern 161 formed in the region overlapping the first monomer block 171 having a relatively low etch rate may have a relatively narrow width.

In order to selectively remove the second monomer block 172 having a relatively high etch rate, a general etching process may be used and for example, a dry etching process may be conducted but is not limited thereto. Gas usable in the etching process may be at least one selected from a group consisting of $O_2$, fluorocarbon gas and HF, but is not limited thereto. The fluorocarbon gas may be one or more selected from a group consisting of $C_4F_8$, $CHF_3$, $CH_2F_2$, $C_4F_8$, $CF_4$ and $C_2F_6$, but is not limited thereto.

Figure 11:
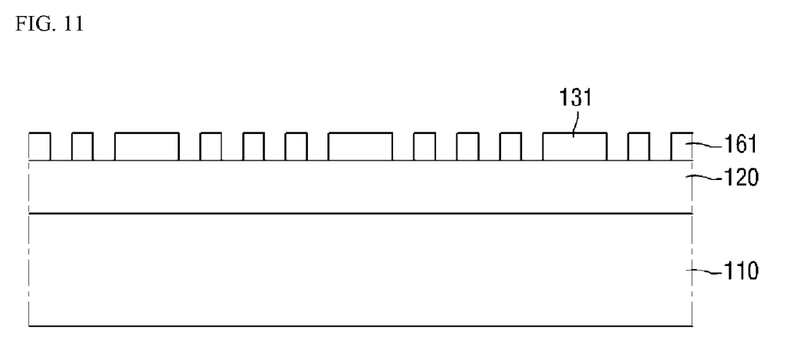

Referring to FIG. 11, the guide patterns 141, the surface treatment layer 150 and the first monomer blocks 171 having a relatively low etch rate may be removed.

In this case, the guide patterns 141, the first monomer blocks 171 having a relatively low etch rate, and the like may be removed through a separate strip process.

In the case of removing the guide patterns 141, the first monomer blocks 171 having a relatively low etch rate, and the like through an etching process, damage to the conductive wire layer 120 may be caused due to a difference in etch rates between the respective materials.

Further, the guide pattern 141 and the first monomer block 171 may be removed easily by reducing adhesion force between the first neutral layer pattern 131 and the guide pattern 141 and between the second neutral layer pattern 161 and the first monomer block 171.

Accordingly, a plurality of parallel second neutral layer patterns 161 may remain on the conductive wire layer 120.

Figure 12:
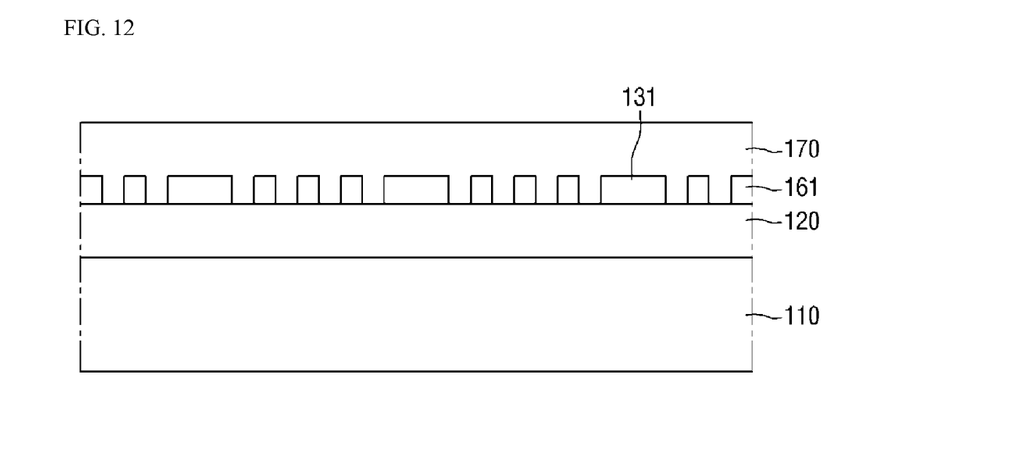

Referring to FIG. 12, the first block copolymers 170 of two monomers having different etch rates may be applied onto portions of the conductive wire layer 120 to which the second neutral layer patterns 161 are exposed and the second neutral layer patterns 161.

In other exemplary embodiments, instead of the first block copolymers 170, second block copolymers (not shown) of two monomers having different etch rates may be applied.

The first block copolymers 170 may be, unlike the disposition thereof in FIG. 8, may be connected to each other on the plurality of parallel second neutral layer patterns 161 and may fill spaces between the plurality of parallel second neutral layer patterns 161.

Since the first block copolymers 170 are described in detail as described above, an overlapped description thereof will be omitted.

Figure 13:
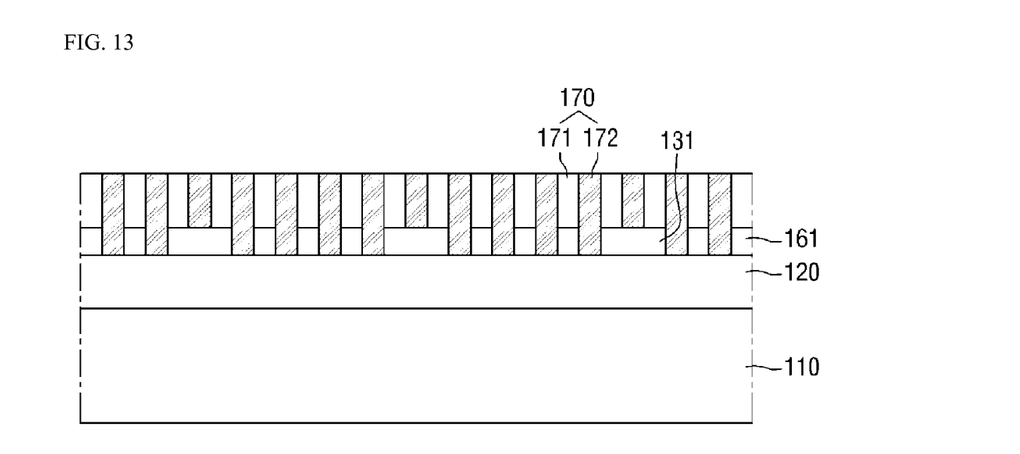

Referring to FIG. 13, the first block copolymers 170 may be phase-separated into the first monomer blocks 171 and the second monomer blocks 172 arranged alternatingly.

In other exemplary embodiments, in the case of applying a second block copolymer in the process of FIG. 12, the second block copolymer may be phase-separated into a third monomer block and a fourth monomer block.

As described above, the first monomer blocks 171 and the second monomer blocks 172 of the first block copolymers 170 may be formed using materials different from each other in terms of etch rates thereof as well as in terms of hydrophilicity and hydrophobicity. In order to arrange the first block copolymers 170, a method such as a thermal annealing method, a solvent annealing method or the like may be used.

In this case, the second neutral layer patterns 161 formed below the first block copolymers 170 may allow the first block copolymers 170 to be effectively arranged. The first monomer blocks 171 having a relatively low etch rate may be arranged in regions overlapping the plurality of consecutive second neutral layer patterns 161, and the second monomer blocks 172 having a relatively high etch rate may be arranged in regions overlapping the conductive wire layer 120 to which the plurality of consecutive second neutral layer patterns 161 are exposed.

In particular, the plurality of first monomer blocks 171 and second monomer blocks 172 may be uniformly arranged on the plurality of consecutive second neutral layer patterns 161.

More specifically, as described above with reference to FIG. 10, the first neutral layer pattern 131 formed in regions overlapping the guide patterns 141 may have a relatively wide width as compared to patterns formed in other regions, the plurality of first monomer blocks 171 and second monomer blocks 172 may be alternatingly arranged on the first neutral layer pattern 131 having relatively wide width. Meanwhile, a single first monomer block 171 and a single second monomer block 172 may be arranged on the plurality of consecutive second neutral layer patterns 161 so as to correspond thereto.

Figure 14:
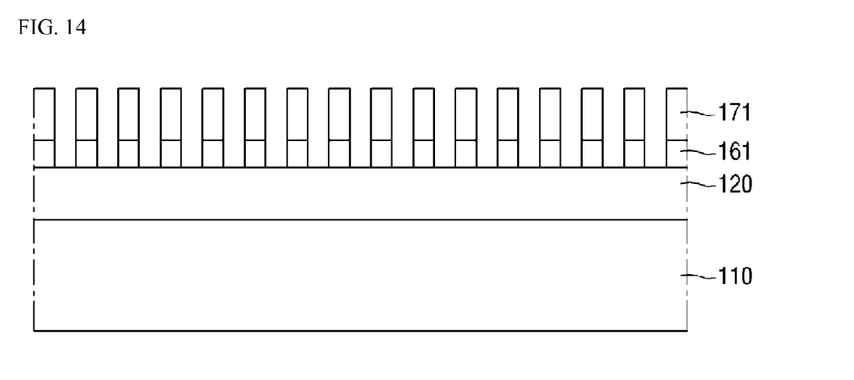

Referring to FIG. 14, the second monomer blocks 172 having a relatively high etch rate may be selectively removed.

In order to selectively remove the second monomer blocks 172 having a relatively high etch rate, a conventional etching process may be used. Since the etching process is identical to the etching process for selectively removing the second monomer blocks 172 as illustrated in FIG. 10, an overlapped description of the etching process may be omitted.

As illustrated in the exemplary embodiment, regions of the second neutral layer patterns 161 overlapping the second monomer blocks 172 having a relatively high etch rate may also be removed simultaneously with selectively removing the second monomer blocks 172 having a relatively high etch rate.

Figure 15:
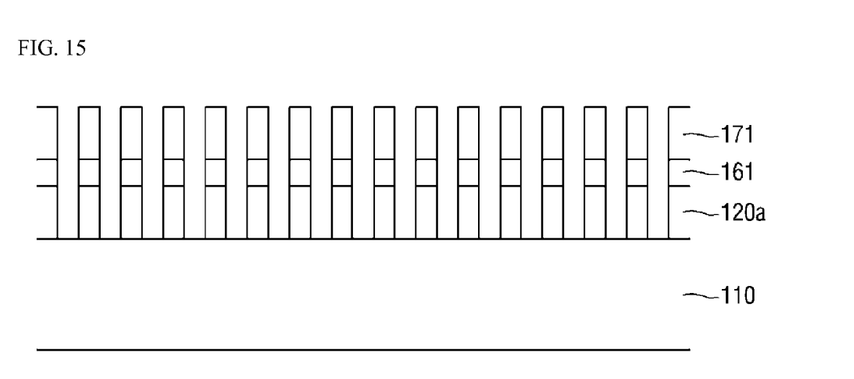
Figure 16:
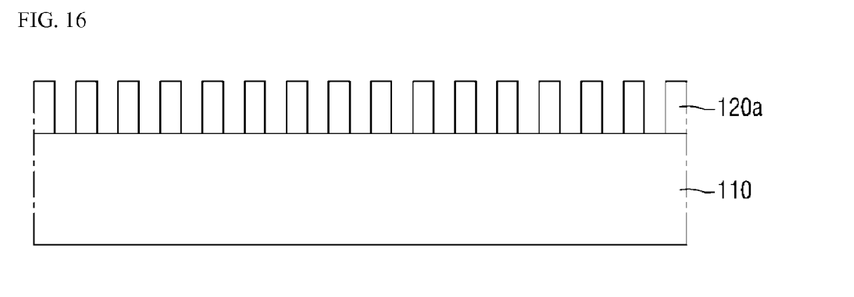

Referring to FIGS. 15 and 16, the conductive wire layer 120 may be etched using the first monomer blocks 171 having a relatively low etch rate and the second neutral layer patterns 161 as a mask. Through this process, as illustrated in FIG. 15, a plurality of parallel conductive wire patterns 120a may be formed on the substrate 110 to be protruded therefrom.

The first monomer blocks 171 and the second neutral layer patterns 161 may be removed during the etching process. As a result, the first monomer blocks 171 and the second neutral layer patterns 161 may not remain on the conductive wire patterns 120a, and the conductive wire patterns 120a illustrated in FIG. 16 may be formed.

In an exemplary embodiment, when the conductive wire layer 120 is etched, the plurality of parallel second neutral layer patterns 161 and the first monomer blocks 171 may remain on upper portions of the plurality of parallel conductive wire patterns 120a, as illustrated in FIG. 15.

In this case, the second neutral layer patterns 161 and the first monomer blocks 171 remained on the upper portions of the conductive wire patterns 120a may be removed through a separate stripping process and consequently, the conductive wire patterns 120a as illustrated in FIG. 16 may be formed.

As described above, according to a method of manufacturing a wire grid polarizer according to an exemplary embodiment of the present inventive concept, the conductive wire patterns 120a having a significantly reduced unpatterned region and a uniform overall interval may be formed, such that a wire grid polarizer having excellent optical properties may be provided.

FIGS. 17 through 27 are cross-sectional views illustrating respective manufacturing processes of a wire grid polarizer after a process of forming the guide pattern layer 140 on the first neutral layer 130, according to another exemplary embodiment of the present inventive concept.

Figure 17:
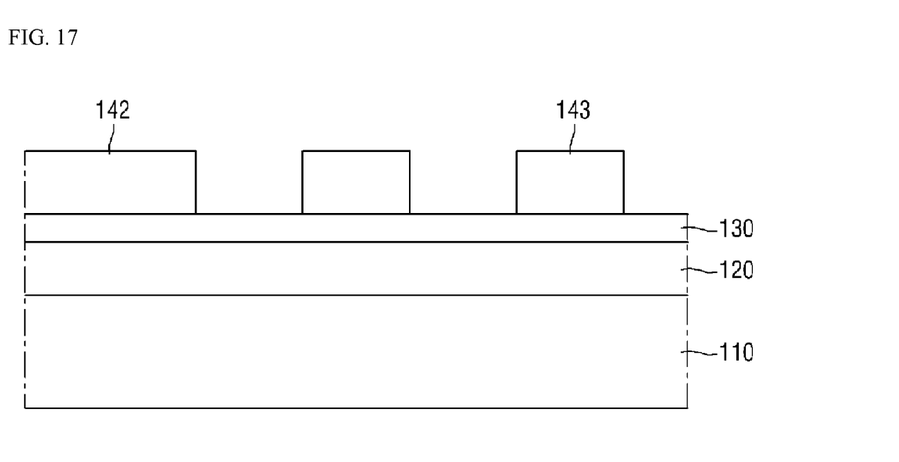
FIGS. 17, 18, 19, 20, 21, 22, 23, 24, 25, 26 and 27 are cross-sectional views illustrating respective manufacturing processes of a wire grid polarizer according to another exemplary embodiment of the present inventive concept.

Referring to FIG. 17, the guide pattern layer 140 of FIG. 3 may be patterned to form a first guide pattern 142 and a second guide pattern 143. In this case, the first guide pattern 142 may be formed in a non-opening region of a display device and the second guide pattern 143 may be formed in an opening region of the display device. Examples of the opening region may correspond to a pixel electrode region and the like. Examples of the non-opening region may include a wiring region, a transistor region and the like. However, the regions are not limited thereto.

Figure 18:
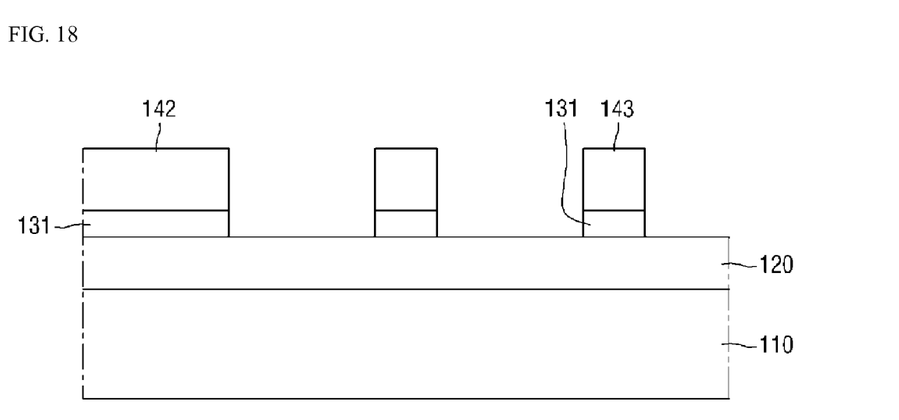

Referring to FIG. 18, a trimming process for reducing widths of the patterned first guide pattern and second guide pattern 142 and 143 may be conducted.

In this case, the first neutral layer 130 may be patterned in the same pattern as those of the first guide pattern 142 and the second guide pattern 143 to form the first neutral layer patterns 131.

The first guide pattern 142 may be formed to have a width greater than that of the second guide pattern 143, such that a portion of the conductive wire layer 120 positioned in a region overlapping the first guide pattern 142 may not be patterned and remain, thereby serving as a reflective layer. The first guide pattern 142 may be formed in a non-display region of a display device, such that it may reflect light incident on the non-display region to allow for an improvement in luminance of the display device. In this case, the first guide pattern 142 may be patterned to have a width corresponding to the non-display region after the trimming process.

Figure 19:
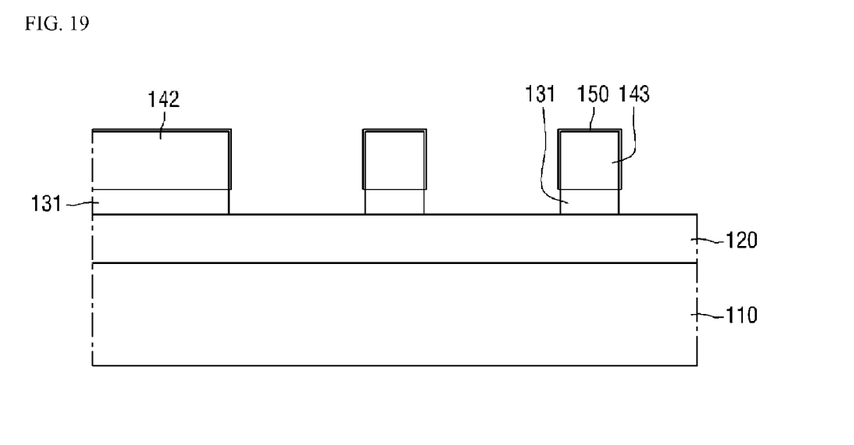

Referring to FIG. 19, the surface treatment layers 150 may be formed on upper and side surfaces of the first guide pattern 142 and the second guide pattern 143. Since the surface treatment layers 150 are described in detail as described above, an overlapped description thereof will be omitted.

Figure 20:
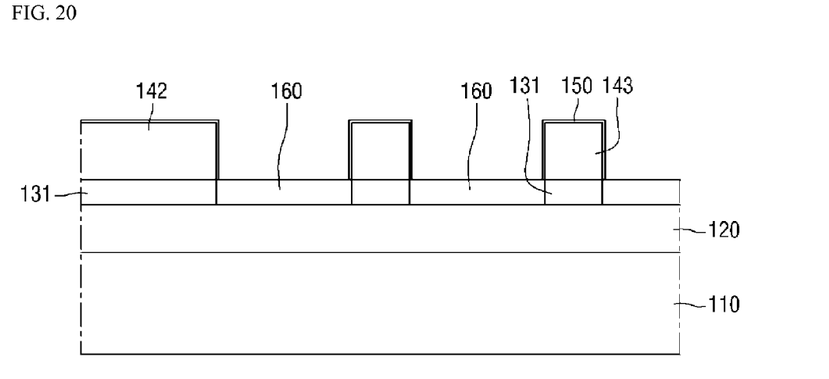

Referring to FIG. 20, the second neutral layer 160 may be coated on portions of the conductive wire layer 120 to which the first neutral layer patterns 131 are removed. Here, the second neutral layer 160 is identical to the second neutral layer 160 illustrated in FIG. 7.

Figure 21:
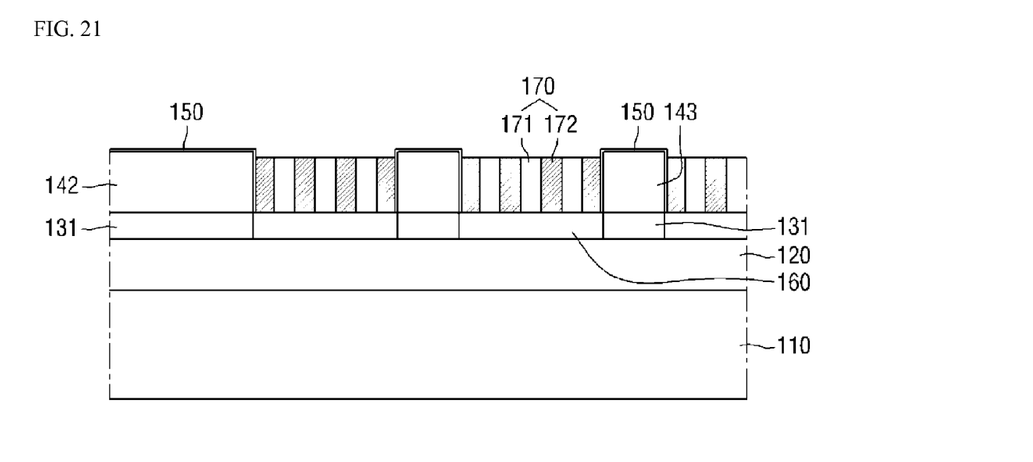

Referring to FIG. 21, trench spaces on the second neutral layer 160 may be filled with the first block copolymers 170 of the first monomer and the second monomer having different etch rates, and the first block copolymers 170 may be phase-separated into the first monomer blocks 171 and the second monomer blocks 172 arranged alternatingly. Here, the first block copolymers 170, the first monomer blocks 171, and the second monomer blocks 172 are identical to the first block copolymers 170, the first monomer blocks 171, and the second monomer blocks 172 illustrated in FIGS. 8 and 9.

Figure 22:
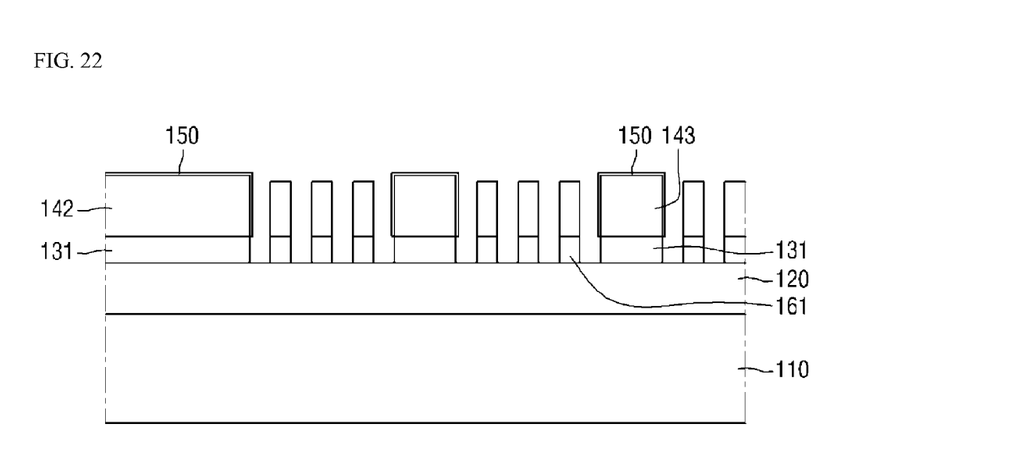

Referring to FIG. 22, the second monomer blocks 172 having a relatively high etch rate may be selectively removed. While the second monomer blocks 172 having a relatively high etch rate are removed, portions of the second neutral layer 160 disposed under the second monomer blocks 172 having a relatively high etch rate may also be removed. The second neutral layer pattern 161 formed in a region overlapping the first guide pattern 142 may have substantially the same width as the first guide pattern 142, and the second neutral layer pattern 161 formed in a region overlapping the second guide pattern 143 may have substantially the same width as the second guide pattern 143.

Figure 23:
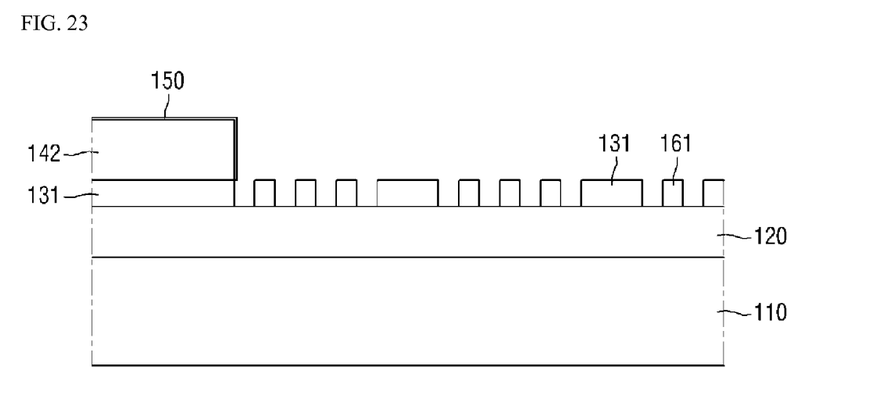

Referring to FIG. 23, the second guide pattern 143, the first monomer blocks 171 having a relatively low etch rate, and the like may be selectively removed.

In this case, the second guide pattern 143, the first monomer blocks 171 having a relatively low etch rate, and the like may be selectively removed through a separate strip process. Meanwhile, the first guide pattern 142 and the first neutral layer patterns 131 may not be removed and may remain. Because the first guide pattern 142 has a relatively wide width than that of the second guide pattern 143 and the first monomer blocks 171, the first guide pattern 142 may not be removed completely and remain on the first neutral layer patterns 131.

As a result, the first guide pattern 142 and the first neutral layer patterns 131 may remain in the non-opening region of the conductive wire layer 120, and the plurality of parallel second neutral layer patterns 161 may be formed in the opening region.

Figure 24:
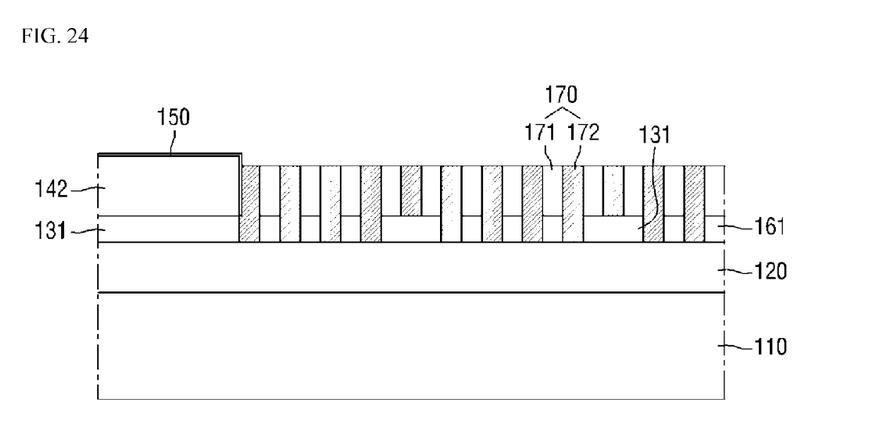

Referring to FIG. 24, the first block copolymers 170 of the first monomer and the second monomer having different etch rates may be provided on portions of the conductive wire layer 120 to which the second neutral layer patterns 161 are exposed and the second neutral layer patterns 161, and the first block copolymers 170 may be phase-separated into the first monomer blocks 171 and the second monomer blocks 172 arranged alternatingly. Here, the first block copolymers 170, and the respective monomer blocks 171 and 172 are identical to the first block copolymers 170, and the respective monomer blocks 171 and 172 illustrated in FIG. 21.

Figure 25:
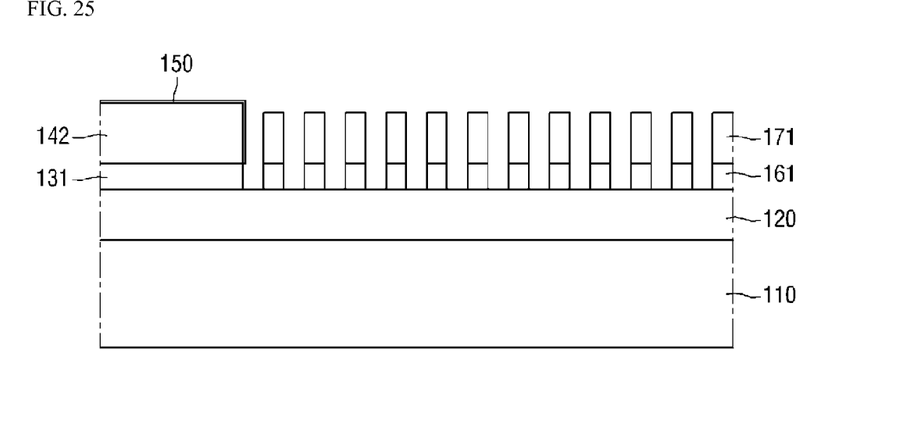

Referring to FIG. 25, the second monomer blocks 172 having a relatively high etch rate may be selectively removed.

As illustrated in the exemplary embodiment, regions of the second neutral layer patterns 161 overlapping the second monomer blocks 172 having a relatively high etch rate may also be removed simultaneously with selectively removing the second monomer blocks 172 having a relatively high etch rate.

Figure 26:
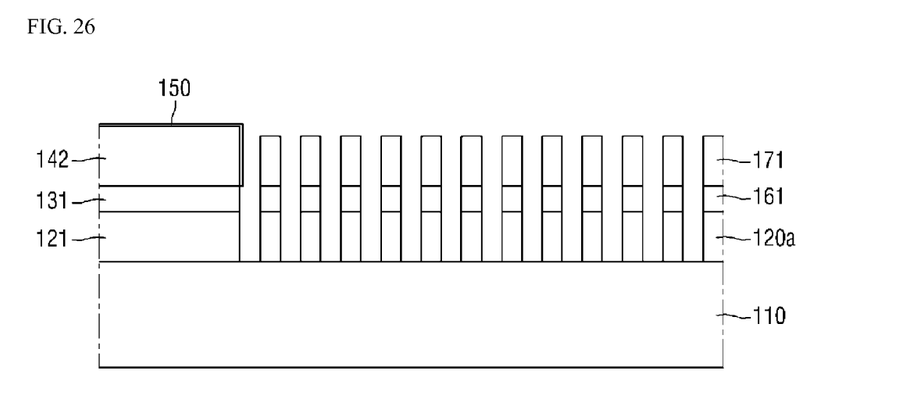
Figure 27:
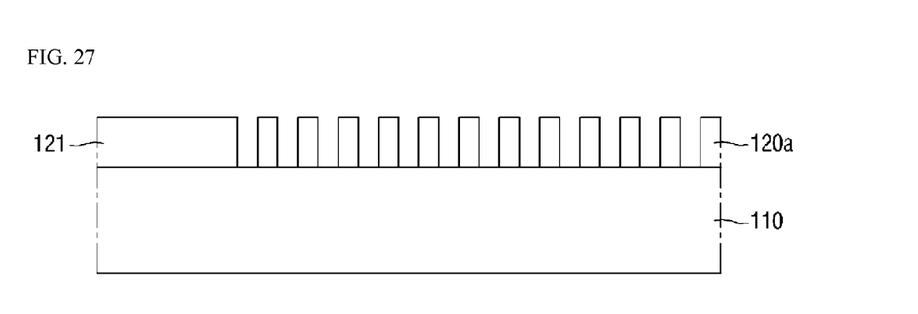

Referring to FIGS. 26 and 27, the conductive wire layer 120 may be etched using the first monomer blocks 171 having a relatively low etch rate and the second neutral layer patterns 161 as a mask. Through this process, as illustrated in FIG. 26, the reflective layer 121 may be formed in the non-opening region of the substrate 110. The plurality of parallel conductive wire patterns 120a, and the second neutral layer patterns 161 and the first monomer blocks 171 sequentially stacked on the plurality of parallel conductive wire patterns 120a may be formed in the opening region.

As the conductive wire layer 120 may be patterned and an etching process may be performed thereon, the first guide pattern 142, the first monomer blocks 171 and the second neutral layer patterns 161 may be removed. As a result, the first guide pattern 142, the first monomer blocks 171 and the second neutral layer patterns 161 may not remain on the reflective layer 121 and the conductive wire patterns 120a. The reflective layer 121 and the conductive wire patterns 120a illustrated in FIG. 27 may be formed.

As described above, in a method of manufacturing a wire gird polarizer according to another exemplary embodiment of the present inventive concept, the conductive wire patterns 120a having a uniform interval in the opening region may be formed to provide excellent optical properties, while the reflective layer 121 may be formed in the non-opening region to provide relatively high reflection effects as compared to the case of forming the conductive wire patterns 120a in the non-opening region.

As set forth above, according to exemplary embodiments of the present disclosure, at least the following effects may be provided.

In the manufacturing method according to exemplary embodiments of the present inventive concept, a width of a guide pattern may be reduced and a neutral layer pattern may be formed, whereby an unpatterned region may be significantly reduced.

In addition, in the manufacturing method according to exemplary embodiments of the present inventive concept, wire grid patterns uniformly provided in the overall surface of the display device may be formed, whereby a wire grid polarizer having excellent optical properties may be provided.

Although preferred embodiments of the present inventive concept have been described for illustrative purposes, those skilled in the art will appreciate that various modifications, additions and substitutions are possible, without departing from the scope and spirit of the inventive concept as disclosed in the accompanying claims. Therefore, the disclosed preferred embodiments of the inventive concept are used in a generic and descriptive sense only and not for purposes of limitation.

What is claimed is:

1. A method of manufacturing a wire gird polarizer, comprising:
   sequentially stacking a conductive wire layer and a first neutral layer on a substrate;
   forming guide patterns having a uniform interval on the first neutral layer;
   reducing widths of the guide patterns and patterning the first neutral layer to thereby form first neutral layer patterns;
   forming a second neutral layer on a portion of the conductive wire layer between the first neutral layer patterns;
   applying a first block copolymer of a first monomer and a second monomer having different etch rates to the second neutral layer;
   arranging the first block copolymer as a first monomer block and a second monomer block;
   removing one of the first monomer block and the second monomer block;
   removing the second neutral layer exposed by removing the one of the first monomer block and the second monomer block;
   removing the remaining monomer block and the guide patterns;
   applying a second block copolymer of a third monomer and a fourth monomer having different etch rates to the resultant product;
   arranging the second block copolymer as a third monomer block and a fourth monomer block;
   removing one of the third monomer block and the fourth monomer block; and
   patterning the conductive wire layer to thereby form conductive wire patterns.

2. The method of claim 1, wherein the first monomer block is identical to the third monomer block and the second monomer block is identical to the fourth monomer block.

3. The method of claim 1,
   wherein the reducing of the widths of the guide patterns includes plasma treatment.

4. The method of claim 3, wherein gas used in the plasma treatment includes O2.

5. The method of claim 4, wherein gas used in the plasma treatment further includes SF6 or CF-based gas.

6. The method of claim 1, wherein the first neutral layer and the second neutral layer contain a random copolymer.

7. The method of claim 1, wherein the arranging of the first block copolymer and the second block copolymer is performed through thermal annealing or solvent annealing.

8. The method of claim 1, wherein the patterning of the conductive wire layer further includes removing a second neutral layer patterns on the conductive wire layer and the monomer blocks on the second neutral layer patterns.

9. The method of claim 1, wherein the reducing of the widths of the guide patterns and the patterning of the first neutral layer to thereby form first neutral layer patterns includes forming surface treatment layers on upper and side surfaces of the guide patterns.

10. The method of claim 9, wherein the surface treatment layers are fluorine-containing hydrophobic layers.

11. A method of manufacturing a wire gird polarizer, comprising:
    sequentially stacking a conductive wire layer and a first neutral layer on a substrate;
    forming guide patterns on the first neutral layer;
    reducing widths of the guide patterns and patterning the first neutral layer to thereby form first neutral layer patterns;
    forming a second neutral layer on a portion of the conductive wire layer between the first neutral layer patterns;
    applying a first block copolymer of a first monomer and a second monomer having different etch rates to the second neutral layer;
    arranging the first block copolymer as a first monomer block and a second monomer block;
    removing one of the first monomer block and the second monomer block;
    removing the second neutral layer exposed by removing the one of the first monomer block and the second monomer block;
    removing the remaining monomer block and the guide patterns;
    applying a second block copolymer of a third monomer and a fourth monomer having different etch rates to the resultant product;
    arranging the second block copolymer as a third monomer block and a fourth monomer block; and
    removing one of the third monomer block and the fourth monomer block and patterning the conductive wire layer to thereby form conductive wire patterns, wherein the guide patterns includes a first guide pattern formed in an opening region and a second guide pattern formed in a non-opening region, and the first guide pattern has a relatively narrower width than that of the second guide pattern.

12. The method of claim 11, wherein the first monomer block is identical to the third monomer block and the second monomer block is identical to the fourth monomer block.

13. The method of claim 11, wherein the reducing of the widths of the guide patterns includes plasma treatment.

14. The method of claim 13, wherein gas used in the plasma treatment includes O2.

15. The method of claim 14, wherein gas used in the plasma treatment further includes SF6 or CF-based gas.

16. The method of claim 11, wherein the first neutral layer and the second neutral layer contain a random copolymer.

17. The method of claim 11, wherein the arranging of the first block copolymer and the second block copolymer is performed through thermal annealing or solvent annealing.

18. The method of claim 11, wherein the patterning of the conductive wire layer further includes removing the first guide pattern, a second neutral layer patterns, and the monomer blocks on the second neutral layer patterns.

19. The method of claim 11, wherein the reducing of the widths of the guide patterns and the patterning of the first neutral layer to thereby form first neutral layer patterns includes forming surface treatment layers on upper and side surfaces of the guide patterns.

20. The method of claim 19, wherein the surface treatment layers are fluorine-containing hydrophobic layers.

* * * * *